(12) United States Patent
Zhang et al.

(10) Patent No.: US 10,267,843 B2
(45) Date of Patent: Apr. 23, 2019

(54) DIRECT CURRENT FAULT ARC DETECTION METHOD

(71) Applicant: SHANGHAI CHINT POWER SYSTEMS CO., LTD., Shanghai (CN)

(72) Inventors: Yulin Zhang, Shanghai (CN); Rong Liu, Shanghai (CN); Jun Zhang, Shanghai (CN)

(73) Assignee: SHANGHAI CHINT POWER SYSTEMS CO., LTD., Shanghai (CN)

( * ) Notice: Subject to any disclaimer, the term of this patent is extended or adjusted under 35 U.S.C. 154(b) by 0 days.

(21) Appl. No.: 15/774,284

(22) PCT Filed: Mar. 3, 2016

(86) PCT No.: PCT/CN2016/075556
§ 371 (c)(1),
(2) Date: May 8, 2018

(87) PCT Pub. No.: WO2017/036112
PCT Pub. Date: Mar. 9, 2017

(65) Prior Publication Data
US 2018/0313887 A1 Nov. 1, 2018

(30) Foreign Application Priority Data
Aug. 31, 2015 (CN) .......................... 2015 1 0548749

(51) Int. Cl.
*G01R 31/12* (2006.01)
*G01R 31/40* (2014.01)

(52) U.S. Cl.
CPC ......... *G01R 31/1272* (2013.01); *G01R 31/12* (2013.01); *G01R 31/40* (2013.01)

(58) Field of Classification Search
CPC ....................................................... G01R 31/12
See application file for complete search history.

(56) References Cited

U.S. PATENT DOCUMENTS

| 6,400,258 B1 * | 6/2002 | Parker ................... G01R 31/12 307/106 |
| 6,772,077 B1 * | 8/2004 | Parker ................... G01R 31/12 361/63 |

(Continued)

FOREIGN PATENT DOCUMENTS

| CN | 101696986 A | 4/2010 |
| CN | 102253293 A | 11/2011 |

(Continued)

*Primary Examiner* — Stephanie E Bloss
(74) *Attorney, Agent, or Firm* — Gokalp Bayramoglu

(57) ABSTRACT

A direct current (DC) fault arc detection method, including performing sampling, filtering and fast Fourier transform (FFT) on an input current of a high frequency power electronics converter, to obtain an amplitude-frequency characteristic curve of a current high frequency component; and selecting, from the amplitude-frequency characteristic curve, at least one frequency band including a switching frequency or a multiple frequency, calculating a peak value D1 of amplitudes and an average value D2 of the amplitudes within the frequency band, and determining, according to a change of a distance between the peak value D1 and the average value D2, whether an arc occurs, where if the average value D2 approaches the peak value D1, an arc occurs; otherwise, no arc occurs.

6 Claims, 3 Drawing Sheets

(56) References Cited

U.S. PATENT DOCUMENTS

| | | | | |
|---|---|---|---|---|
| 2001/0040458 A1* | 11/2001 | MacBeth | ............... | G01R 31/12 |
| | | | | 324/536 |
| 2006/0119368 A1* | 6/2006 | Sela | ................... | G01R 19/2513 |
| | | | | 324/522 |
| 2011/0141644 A1* | 6/2011 | Hastings | ........... | H01L 31/02021 |
| | | | | 361/93.2 |
| 2011/0273183 A1* | 11/2011 | Shea | .................... | H02H 1/0015 |
| | | | | 324/536 |
| 2013/0226479 A1* | 8/2013 | Grosjean | ............. | G01R 31/024 |
| | | | | 702/58 |
| 2014/0198413 A1* | 7/2014 | Koch | ................. | G01R 31/3272 |
| | | | | 361/2 |
| 2016/0020729 A1* | 1/2016 | Yu | ........................... | H02S 50/10 |
| | | | | 324/761.01 |

FOREIGN PATENT DOCUMENTS

| | | |
|---|---|---|
| CN | 102721896 A | 10/2012 |
| CN | 102914709 A | 2/2013 |
| CN | 103812081 A | 5/2014 |
| CN | 105093082 A | 11/2015 |
| WO | 9525364 A1 | 9/1995 |

* cited by examiner

US 10,267,843 B2

DIRECT CURRENT FAULT ARC DETECTION METHOD

CROSS REFERENCE TO THE RELATED APPLICATIONS

This application is the national phase entry of International Application No. PCT/CN2016/075556, filed on Mar. 3, 2016, which claims priority from Chinese Patent Application 201510548749.4, filed on Aug. 31, 2015, the entire contents of which are incorporated herein by reference.

TECHNICAL FIELD

The present invention provides a new method for direct current (DC) fault arc detection, so as to effectively determine whether a fault arc occurs and report an error in time after it is detected that a fault arc occurs, thereby improving system security. The present invention may be applied to the field of DC power converters, such as a UPS battery system and a photovoltaic power generation system.

BACKGROUND

In recent years, as clean energy, energy storage systems, and the like rapidly develop, so do DC power conversion systems. Because of large currents and high voltages in these systems, fault arcs are more likely to occur.

An arc is the phenomenon of electric discharge occurring when contacts in a conductor through which large currents pass or the contacts and another conductor are unreliably connected due to poor contact caused by unreliable connection between joints or insulation aging of a joint or a conducting wire. An arc is a major cause of fire in a DC system, and therefore whether occurrence of an arc is detected in time and accurately directly affects the security and reliability of the DC system.

Arcs include series arcs and parallel arcs. The former is arcs between cables and the latter is electric discharge from a DC end to a safety ground. The present invention mainly aims to resolve series arcs.

A photovoltaic power generation system is a DC application of high voltages and large currents. With the rapid growth of the photovoltaic industry, there are a growing number of mounted photovoltaic system devices. Security of photovoltaic systems is challenged by gradual aging of photovoltaic power generation devices put into operation and negligence during manual mounting. A DC side voltage of a photovoltaic system can reach up to hundreds of volts with the configuration of a photovoltaic panel. If a fault arc occurs, because there is no zero-crossing protection, a DC arc is more dangerous than an alternating current arc. Energy is generated when the photovoltaic panel of the photovoltaic system is continuously exposed in sunshine. If the fault arc that occurs is not perceived in time and a circuit is not cut off, while the panel provides outpouring energy to the arc, the power transmission circuit and the photovoltaic device are both greatly damaged. What's worse, fire is caused and life is threatened.

In view of safety and reliability, a growing number of DC applications propose requirements for detecting DC arcs. Some of the requirements have been forcibly required to be executed. For example, the 2011 version of US National Electrical Code (NEC) started to require to mount an arc fault detection circuit breaker on a photovoltaic power generation system. Requirements on DC fault arc detection in the NEC are specified in the UL1699B standard. The specification requires that an inverter should provide a visible alarm when detecting a fault arc and the alarm cannot be deleted automatically. The alarm should still be displayed when power is on again after a blackout, and the inverter can perform grid-tied working only after the alarm is manually deleted. An inverter needs to have a fault arc manual/automatic detection function, and the inverter needs to provide an alarm on a visible interface when performing automatic detection. If the automatic detection does not pass, the alarm needs to be manually deleted; otherwise, the alarm is saved and still exists when the inverter is restarted after a blackout. The UL1699B further specifies requirements on protection time, external environment, and the like.

On one hand, reliable and accurate arc detection is undoubtedly quite important to security of a DC system. On the other hand, how to prevent a detection unit from performing erroneous detection is also a difficulty during actual implementation. As required in the 2011 US NEC, after a detection unit gives an arc alarm, a photovoltaic inverter needs to stop power generation and is not allowed to continue to perform grid-tied power generation until an operator detects and manually deletes the alarm. Therefore, an erroneous detection may cause frequent shutdowns of a photovoltaic power generation system, affecting power generation benefit of the system.

Currently, common detection methods are as follows:

1. Determining Based on Radio Frequency Noises Generated by an Arc

In WO 95/25374, based on that radio frequency noises within a frequency band are generated after a DC current arc occurs, noise signals are received by using a radio frequency receiving apparatus, frequency division processing is performed, and noise amplitudes before and after an arc occurs are compared, to detect whether an arc occurs.

Because a power electronics device may generate noises, and electronic devices are more widely used, this solution cannot avoid erroneous detection. In addition, when a plurality of devices synchronously runs, a location where an arc occurs cannot be accurately determined or found.

2. Detection Based on Changes of Amplitudes of a DC Current High Frequency Component National Instruments Corporation proposes to perform determining according to amplitudes of a DC current frequency spectrum.

The principle of this solution is also that high frequency noises may be caused to currents after a DC arc occurs. However, in this detection manner, DC currents are collected and FFT is performed on the currents, so that amplitude-frequency characteristics of the currents are obtained, and differences of amplitudes within a frequency band before and after an arc occurs are determined, thereby determining whether an arc occurs.

This solution is widely used because of relatively accurate detection and low costs. A disadvantage of the solution is also that the solution is subject to noise interference caused by a power electronics circuit and a surrounding device. When noise signals in the DC currents in the device are relatively large, this solution cannot be used or erroneous reports are frequently generated.

SUMMARY

An objective of the present invention is to provide a series arc detection method capable of avoiding erroneous detection and not being subject to noise interference caused by a power electronics circuit and a surrounding device.

To achieve the foregoing objective, the technical solutions of the present invention provide a DC fault arc detection method, including the following steps:

step 1: performing sampling, filtering and fast Fourier transform (FFT) on an input current of a high frequency power electronics converter, to obtain an amplitude-frequency characteristic curve of a current high frequency component;

step 2: selecting, from the amplitude-frequency characteristic curve, at least one frequency band including a switching frequency or a multiple frequency, calculating a peak value D1 of amplitudes and an average value D2 of the amplitudes within the frequency band, and determining, according to a change of a distance between the peak value D1 and the average value D2, whether an arc occurs, where if the average value D2 approaches the peak value D1, an arc occurs; otherwise, no arc occurs.

Preferably, in the step 2, a difference D3 between the peak value D1 and the average value D2 is calculated, the difference D3 is divided by the average value D2 to obtain a percentage D4, and statistics about a quantity X of the percentage D4 smaller than a threshold T1 in N pieces of data are collected, and if X is greater than a threshold T2, an arc occurs; otherwise, no arc occurs.

Preferably, in the step 2, a calculation method of the peak value D1 is: obtaining a moving average value of every Y amplitudes within the selected frequency band, so that the peak value D1 is obtained.

Preferably, in the step 2, a calculation method of the average value D2 is: removing the largest A % pieces of amplitudes from the amplitudes within the selected frequency band, removing the smallest B % pieces of amplitudes from the amplitudes, and obtaining an average value of the remaining amplitudes, so that the average value D2 is obtained.

In the field of DC power converters, a new DC fault arc detection method is provided in the present invention. A noise signal is generated by a DC current high frequency component by using an inherent characteristic of a converter at a multiple frequency of a switching frequency of the converter, and a frequency spectrum of a fault arc is analyzed and calculated by using the noise signal, to detect whether a fault arc occurs.

DETAILED DESCRIPTION

To make the present invention more comprehensible, detailed description is provided below by using preferred embodiments and with reference to the accompanying drawings.

The present invention provides a DC arc detection method combined with an inherent characteristic of a power electronics converter. Most of current power electronics converters use the principle of pulse width modulation (PWM) high frequency chopping, and chop a DC current into a DC impulse current by using high frequency (usually 500 Hz to several kHz) switching of a switching device. In this way, the DC current generates, on a frequency band that is at a switching frequency and at a multiple frequency of the switching frequency, a signal having an amplitude higher than that of a signal generated at a nearby frequency. When an arc occurs, because a frequency spectrum of the current, taken as a whole, is lifted up, changes of noise amplitudes at the switching frequency and the multiple frequency of the switching frequency of the converter are smaller than changes of noise amplitudes on a nearby frequency band.

Figure 1:
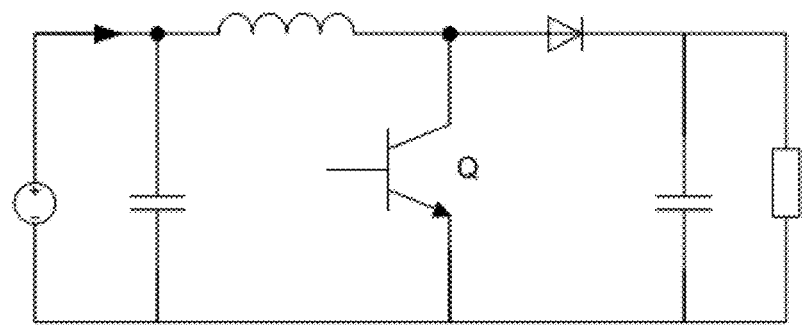
FIG. 1 shows a commonly used BOOST circuit.
Figure 2:
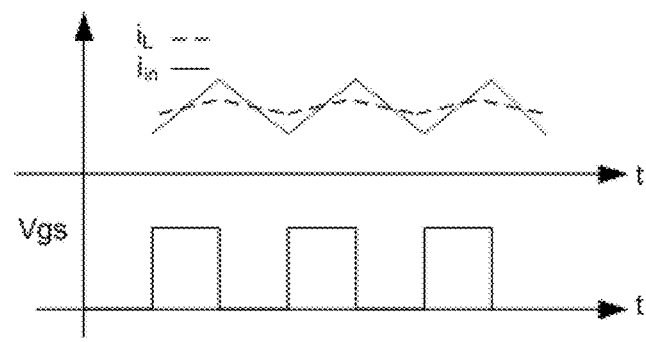
FIG. 2 shows a drive signal of a BOOST circuit.

A commonly used BOOST circuit shown in FIG. 1 is used as an example for description. A switch Q is a high frequency switch, a drive signal of the switch is Vgs shown in FIG. 2, and an inductance current and an input current are respectively $i_L$ and $i_{in}$. It can be learned from a waveform that the input DC current has an abundant of switching frequency secondary noises.

Figure 3:
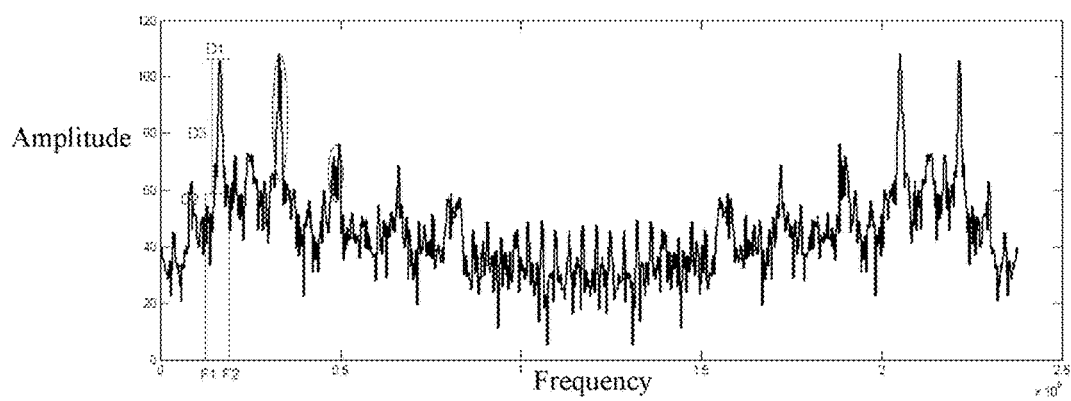
FIG. 3 shows an amplitude-frequency characteristic curve when no arc occurs.

FFT is performed on the input current, so that an amplitude-frequency characteristic of the input current is obtained, as shown in FIG. 3. Using a switching frequency 16 kHz as an example, it can be learned that within a frequency band of F1 to F2, a noise peak value D1 at the switching frequency 16 kHz is far higher than an average value D2 within the frequency band, and cases are the same at multiple frequencies of 16 kHz, such as 32 kHz and 48 kHz.

Within the frequency band of F1 to F2, if D3 is defined as a difference between the peak value D1 and the average value D2, a quantization parameter, that is, a ratio D3/D2 of the D3 to the D2 may be used to determine whether an arc occurs, and if no arc occurs, the D3/D2 is relatively large.

Figure 4:
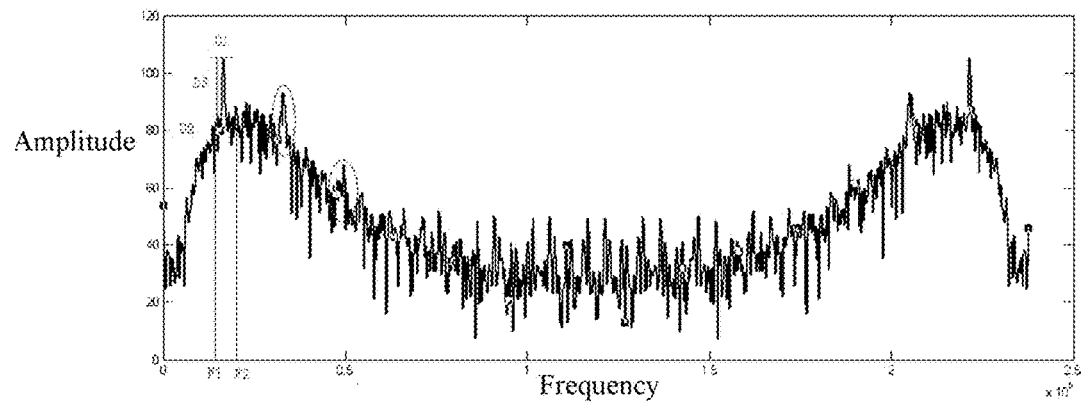
FIG. 4 shows an amplitude-frequency characteristic curve when an arc occurs.

The FFT amplitude-frequency characteristic of the input current after an arc occurs is shown in FIG. 4. It can be learned that because the amplitudes, taken as a whole, are lifted up by high frequency noises generated by the arc, the peak value D1 within the frequency band including the switching frequency or a frequency band including a multiple frequency is greatly reduced relative to the average value D2 within the frequency band.

It can be learned from the foregoing analysis that, for a high frequency power electronics converter, an amplitude-frequency characteristic of a current after an arc occurs has two apparent characteristics:

1. In some frequency bands, amplitudes are apparently lifted up.
2. At a position near a switching frequency and a multiple frequency of the switching frequency, because an amplitude of a high frequency signal of the converter is drowned by an arc noise or is apparently smaller relative to a peak value, noises of the switching converter at the switching frequency and the multiple frequency of the switching frequency are unchanged, and noises on other frequency bands are bigger because of the arc noise.

Based on the foregoing analysis, an arc detection process provided in the present invention is as follows:

1. performing sampling, filtering and FFT on an input current, to obtain an amplitude-frequency characteristic of a current high frequency component;
2. selecting a to-be-compared frequency band according to a switching characteristic of a converter, to determine whether an amplitude is larger.
3. selecting one or more frequency bands including a switching frequency or a multiple frequency, calculating a largest value D1 and an average value D2 within the frequency band, and determining whether an arc occurs by performing logical calculation according to the phenomenon that an average value is larger and a largest value is substantially unchanged after an arc occurs.

Using a photovoltaic inverter as an example, the following provides an implementation of performing arc detection by using the method in the present invention.

Figure 5:
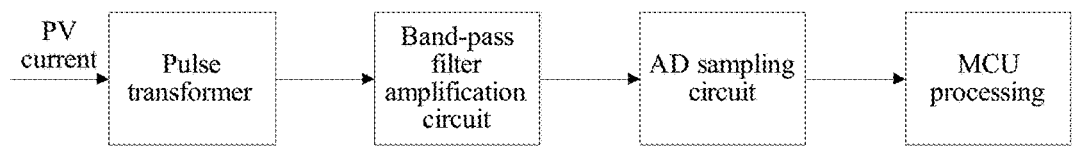
FIG. 5 shows an implementation of performing arc detection by using a method provided in the present invention and by using a photovoltaic inverter as an example.

1) Current data is obtained by sampling a DC current by using a pulse transformer, a band-pass filter, an AD adapter and an MCU processor, as shown in FIG. 5.

Figure 6:
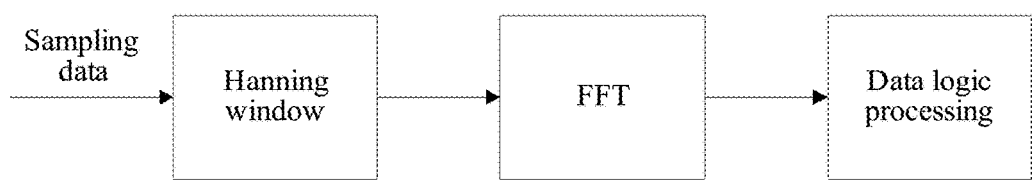
FIG. 6 is a flowchart of an MCU processing part.

2) In the MCU processing part, Hanning window and FFT are sequentially performed on the sampling data, to convert a time domain into a frequency domain, and a high frequency signal amplitude is calculated before a data logic processing is performed, as shown in FIG. 6.

3) In the data logic processing part, a noise signal generated according to an inherent characteristic of a machine is mainly used. The noise signal of the machine is mainly located at a multiple frequency of a switching frequency of the machine. FIG. 4 shows a frequency spectrum when a fault arc occurs, and FIG. 3 shows a frequency spectrum when no fault arc occurs.

In the figures, for example, the switching frequency of the machine is 16 kHz. As shown in the frequency spectrums, the machine has apparent noise signals near 16 kHz, 32 kHz, and 48 kHz regardless of whether an arc fault occurs.

Figure 7:
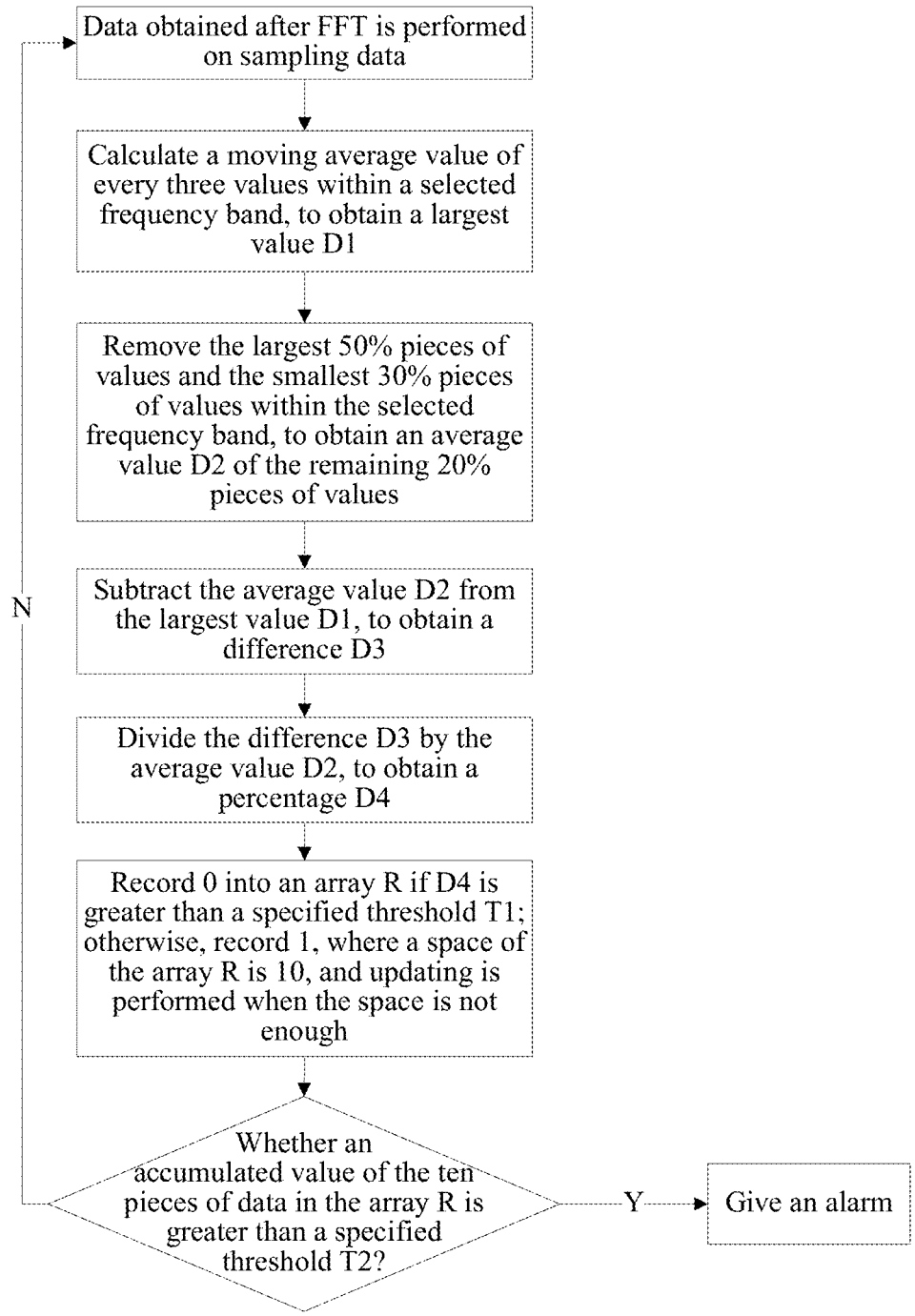
FIG. 7 is an overall flowchart of the present invention.

Based on the foregoing two points, the MCU selects a frequency band near the multiple frequencies for processing. For example, two frequency bands 27 kHz to 37 kHz and 43 kHz to 53 kHz may be selected in FIG. 3 and FIG. 4 for processing. With reference to FIG. 7, the processing process is as follows (where D1, D2, and D3 are marked in FIG. 3).

Step 1: Calculate a moving average value of Y pieces of data within the frequency band, and select a largest value D1 after comparison. In the present invention, by using the largest moving average value instead of directly using a largest value, interference is considered, and filtering to an extent is reached by using the moving average value.

Step 2: Remove large values and small values of a specific percentage within the frequency band to obtain an average value D2.

Step 3: Subtract D2 from the largest value D1, to obtain a difference D3.

Step 4: Divide the difference D3 by the average value D2, to obtain a percentage D4, and collect statistics about a quantity X of the percentage D4 smaller than a threshold T1 in N pieces of data, where if X is greater than a threshold T2, an arc occurs; otherwise, no arc occurs.

This algorithm has the following advantage over an algorithm in which only amplitude values within some frequency band are determined: first, the difference D3 when an arc fault occurs is smaller than the difference D3 when no arc fault occurs; secondly, the average value D2 when an arc fault occurs is greater than the average value D2 when no arc fault occurs; finally, by dividing D3 by D2, a numerator is smaller and a denominator is larger when an arc fault occurs, so that an obtained numerical value is certainly smaller and can be more easily distinguished.

The present invention uses the noise signal in consideration of the following two points: First, amplitudes of a frequency spectrum, taken as a whole, are lifted up when an arc fault occurs; Secondly, an amplitude of a peak value at a multiple frequency is substantially unchanged.

What is claimed is:

1. A direct current (DC) fault arc detection method, comprising the following steps:
    step 1: performing sampling, filtering and fast Fourier transform (FFT), by using a pulse transformer, a band-pass filter, an AD adapter and an MCU processor, on an input current of a high frequency power electronics converter, to obtain an amplitude-frequency characteristic curve of a current high frequency component; and
    step 2: selecting, from the amplitude-frequency characteristic curve, at least one frequency band comprising a switching frequency or a multiple frequency, calculating a peak value D1 of amplitudes and an average value D2 of the amplitudes within the frequency band, and determining, according to a change of a distance between the peak value D1 and the average value D2, whether an arc occurs, wherein if the average value D2 approaches the peak value D1, an arc occurs; otherwise, no arc occurs;
    wherein in the step 2, a difference D3 between the peak value D1 and the average value D2 is calculated, the difference D3 is divided by the average value D2 to obtain a percentage D4, and statistics about a quantity X of the percentage D4 smaller than a first threshold T1 in a predetermined number of pieces of data are collected, and if X is greater than a second threshold T2, the arc occurs; otherwise, no arc occurs;
    step 3: reporting an error after it is detected that the arc occurs.

2. The DC fault arc detection method according to claim 1, wherein in the step 2, a calculation method of the peak value D1 includes:
    calculating a moving average value of every Y amplitude of data within the frequency band;
    and selecting a largest value after comparison to obtain the peak largest value D1;
    and Y indicates a number of the amplitudes with the frequency band.

3. The DC fault arc detection method according to claim 1, wherein in the step 2, a calculation method of the average value D2 includes: removing a first predetermined percentage of largest amplitudes from the amplitudes within the frequency band, removing a second predetermined percentage of smallest amplitudes from the amplitudes within the frequency band, and obtaining an average value of the remaining amplitudes, so that the average value D2 is obtained.

4. The DC fault arc detection method according to claim 3, wherein the first predetermined percentage is 50%.

5. The DC fault arc detection method according to claim 3, wherein the second predetermined percentage is 30%.

6. The DC fault arc detection method according to claim 3, wherein a percentage of the remaining amplitude is 20%.

\* \* \* \* \*